(12) United States Patent
Johnson

(10) Patent No.: US 11,508,453 B2
(45) Date of Patent: Nov. 22, 2022

(54) ENCODING TEST DATA OF MICROELECTRONIC DEVICES, AND RELATED METHODS, DEVICES, AND SYSTEMS

(71) Applicant: Micron Technology, Inc., Boise, ID (US)

(72) Inventor: Jason M. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 61 days.

(21) Appl. No.: 16/996,120

(22) Filed: Aug. 18, 2020

(65) Prior Publication Data
US 2022/0059177 A1 Feb. 24, 2022

(51) Int. Cl.
| | |
|---|---|
| G11C 29/38 | (2006.01) |
| G01R 31/317 | (2006.01) |
| G06F 11/10 | (2006.01) |
| G11C 11/4076 | (2006.01) |
| G11C 11/408 | (2006.01) |
| G11C 11/4091 | (2006.01) |

(52) U.S. Cl.
CPC ........ *G11C 29/38* (2013.01); *G01R 31/31712* (2013.01); *G06F 11/1068* (2013.01); *G11C 11/4076* (2013.01); *G11C 11/4087* (2013.01); *G11C 11/4091* (2013.01)

(58) Field of Classification Search
None
See application file for complete search history.

(56) References Cited

U.S. PATENT DOCUMENTS 7,196,952 B1 * 3/2007 Trinh ................ G11C 29/78
365/201
11,114,181 B1 * 9/2021 Wieduwilt .......... G11C 29/787
(Continued)

FOREIGN PATENT DOCUMENTS

| JP | 3914839 B2 * | 5/2007 | .......... G06F 11/1012 |
| WO | WO-9535573 A1 * | 12/1995 | ............. G11C 29/56 |
| WO | WO-0107924 A1 * | 2/2001 | ............. G11C 29/44 |

OTHER PUBLICATIONS

Amrie Bin Shaari et al., U.S. Appl. No. 16/782,949 titled Microelectronic Device Testing and Associated Methods, Devices and Systems, filed Feb. 5, 2020.
(Continued)

*Primary Examiner* — Guerrier Merant
(74) *Attorney, Agent, or Firm* — TraskBritt

(57) ABSTRACT

Memory devices are disclosed. A memory device may include a number of column planes, and at least one circuit. The at least one circuit may be configured to receive test result data for a column address for each column plane of the number of column planes of the memory array. The at least one circuit may also be configured to convert the test result data to a first result responsive to only one bit of a number of bits of the number of column planes failing a test for the column address. Further, the at least one circuit may be configured to convert the test result data to a second result responsive to only one column plane failing the test for the column address and more than one bit of the one column plane being defective. Methods of testing a memory device, and electronic systems are also disclosed.

20 Claims, 10 Drawing Sheets

(56) References Cited

U.S. PATENT DOCUMENTS

| | | | |
|---|---|---|---|
| 2003/0204797 A1* | 10/2003 | Lin | G11C 29/48 |
| | | | 714/718 |
| 2005/0133420 A1* | 6/2005 | Rinker | A23L 33/10 |
| | | | 222/53 |
| 2006/0269480 A1* | 11/2006 | Amir | A61K 47/555 |
| | | | 977/754 |
| 2007/0255982 A1* | 11/2007 | Adsitt | G11C 29/56 |
| | | | 714/718 |
| 2009/0187809 A1* | 7/2009 | Fekih-Romdhane | |
| | | | G06F 11/1008 |
| | | | 714/763 |
| 2014/0146624 A1* | 5/2014 | Son | G06F 11/1048 |
| | | | 365/200 |
| 2016/0155515 A1* | 6/2016 | Son | G11C 11/1673 |
| | | | 714/719 |
| 2017/0198308 A1* | 7/2017 | Qi | C12N 9/22 |
| 2019/0192691 A1* | 6/2019 | Barrett | C12N 5/0647 |
| 2019/0227022 A1* | 7/2019 | Harley-Trochimczyk | |
| | | | A61B 5/01 |
| 2020/0082902 A1* | 3/2020 | Takahashi | G11C 29/30 |
| 2020/0101142 A1* | 4/2020 | Suri | A61K 38/2086 |
| 2021/0375385 A1* | 12/2021 | Chiang | G11C 29/44 |

OTHER PUBLICATIONS

Rich-Plotkin et al., U.S. Appl. No. 16/685,816 titled Apparatuses and Methods to Encode Column Plane Compression Data, filed Nov. 15, 2019.

* cited by examiner

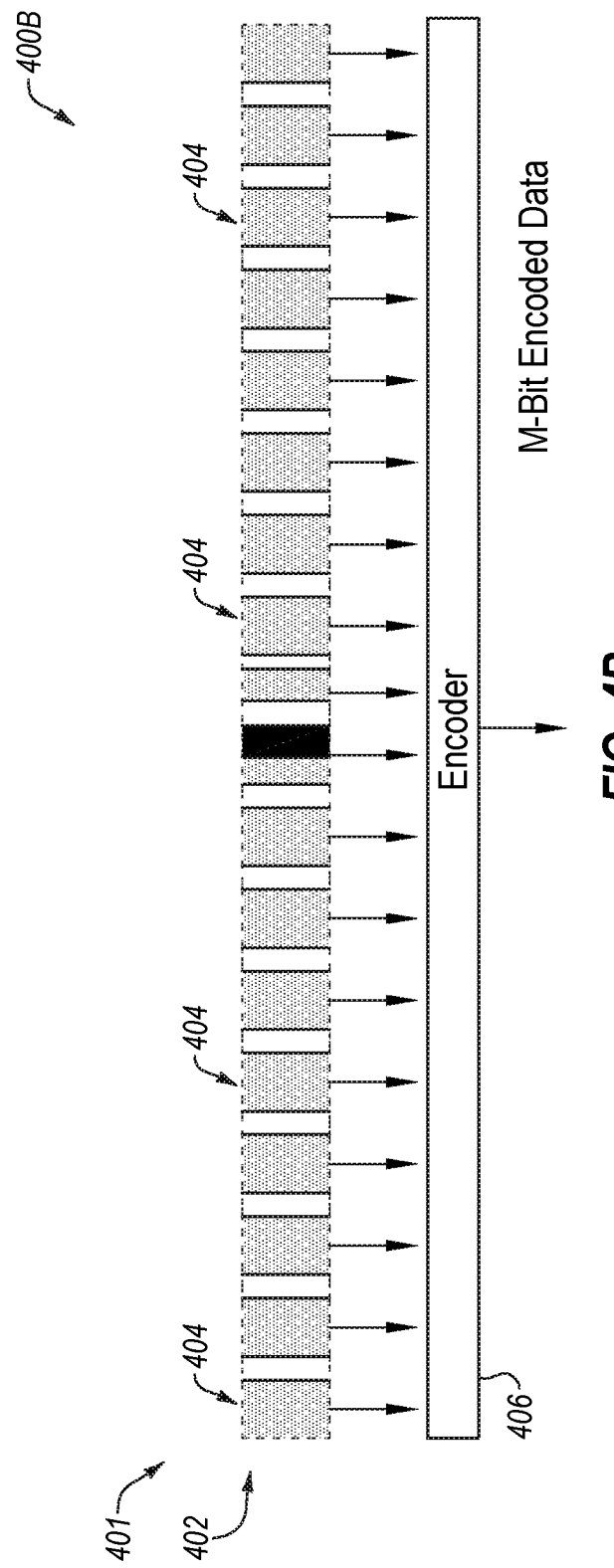

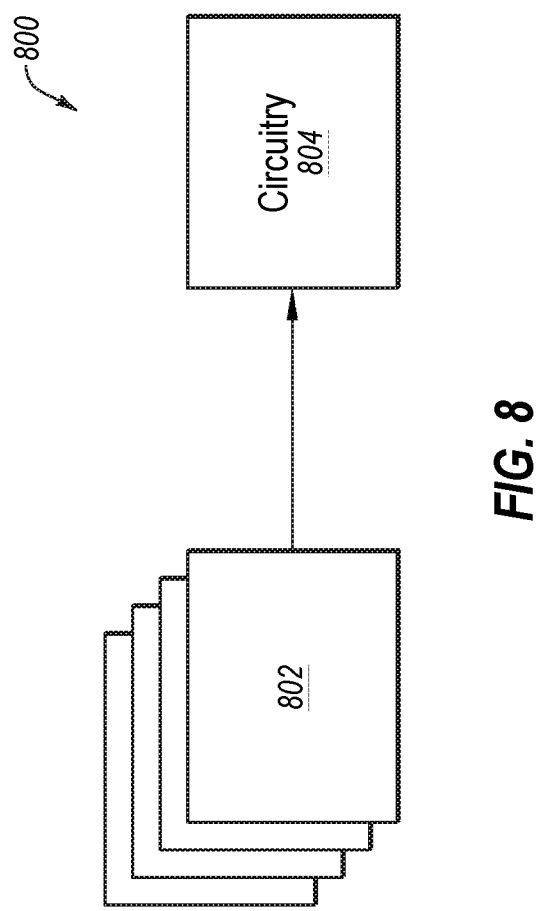

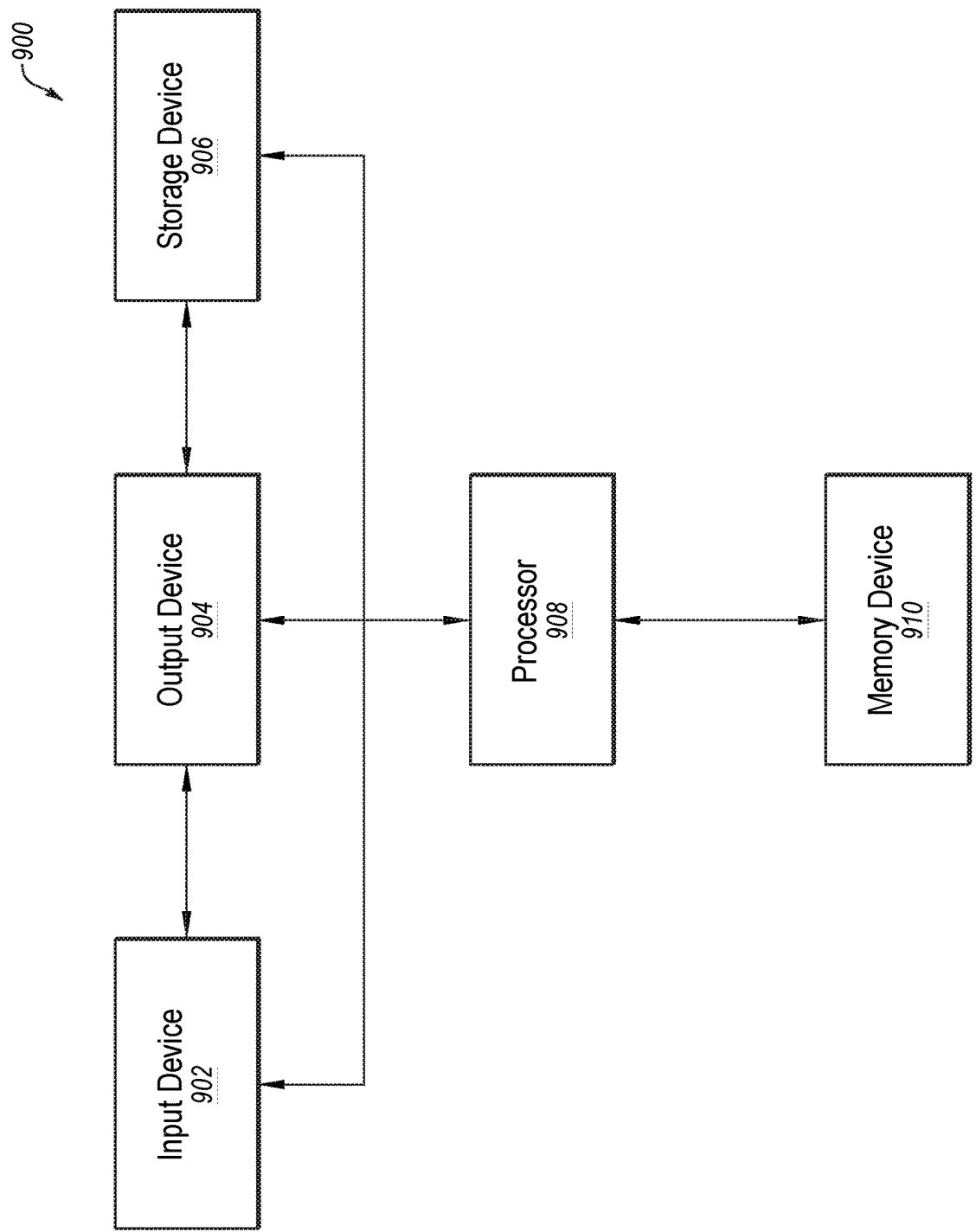

ENCODING TEST DATA OF MICROELECTRONIC DEVICES, AND RELATED METHODS, DEVICES, AND SYSTEMS

TECHNICAL FIELD

Embodiments of the disclosure relate generally to microelectronic devices. More specifically, various embodiments relate to encoding test data of microelectronic devices, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Memory devices typically include many memory cells that are capable of holding a charge that is representative of a bit of data. Typically, these memory cells are arranged in a memory array. Data may be written to or retrieved from a memory cell by selectively activating the memory cell via an associated word line driver.

BRIEF DESCRIPTION OF THE DRAWINGS

FIG. 4B depicts an example memory device including a number of elements coupled to an encoder, in accordance with various embodiments of the present disclosure.

FIG. 8 is a simplified block diagram of a memory system, in accordance with various embodiments of the present disclosure.

FIG. 9 is a simplified block diagram of an electronic system, in accordance with various embodiments of the present disclosure.

DETAILED DESCRIPTION

Figure 1:
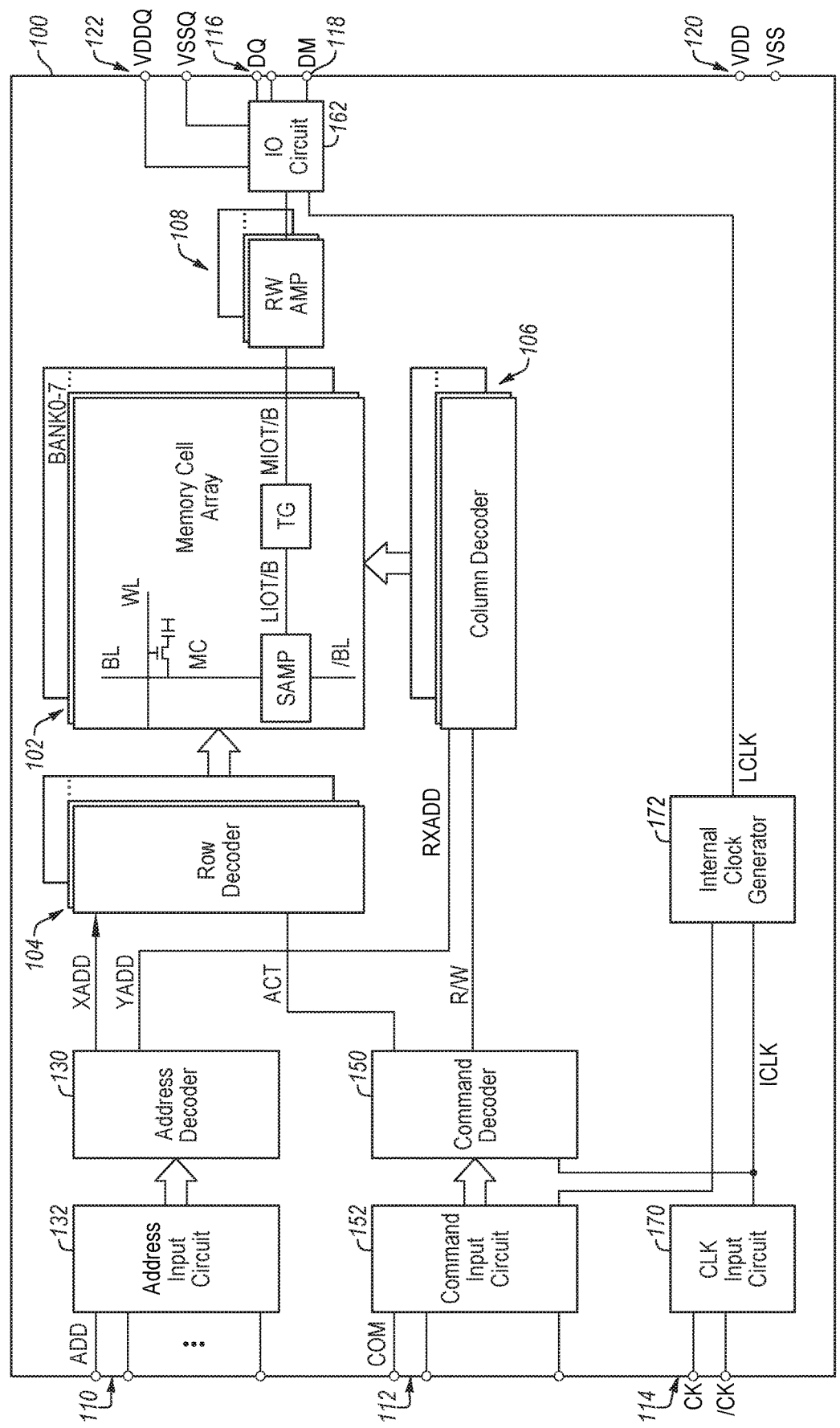
FIG. 1 is a block diagram of an example memory device, in accordance with at least one embodiment of the present disclosure.

A semiconductor memory device typically includes an array of memory cells. Memory cells in the array are selected for reading and writing by means of row and column address signals input to the memory device. The row and column address signals are processed by address decoding circuitry to select row lines and column lines in the array to access the desired memory cell or memory cells.

When semiconductor devices are manufactured, defective memory cells may occur in the memory array or in a sub-array. To salvage the semiconductor memory device despite these defective memory cells, and thus to increase overall yield in the manufacturing process, redundancy is commonly implemented. Redundant memory cells are located in the memory array and the memory array may be associated with a number of redundant memory cells. When a defective memory cell is detected in the array, redundant decoding circuitry associated with the redundant memory cells may be programmed (e.g., via fuse, antifuse, or other programming techniques) to respond to the address of the defective memory cell. When the address of the defective memory cell is selected for access, the redundant memory cell may be accessed (e.g., read from or written to) rather than the defective memory cell.

As disclosed in U.S. patent application Ser. No. 16/782,949, titled "MICROELECTRONIC DEVICE TESTING, AND ASSOCIATED METHODS, DEVICES, AND SYSTEMS," filed Feb. 5, 2020, and U.S. patent application Ser. No. 16/685,186, titled "APPARATUSES AND METHODS TO ENCODE COLUMN PLANE COMPRESSION DATA," filed Nov. 15, 2019, encoded column plane compression systems are configured to encode column plane information and output the encoded data during a read burst. Further, as will be appreciated, some semiconductor memory devices may include error detection and/or error correcting codes (ECC) to correct errors (e.g., single bit errors). If ECC is used (i.e., to correct single bits), full visibility (i.e., 1× visibility) may be required to identify which specifics bits are failing. As will be appreciated, if a single bit fails on an ECC word (i.e., no other fails exist on that same word throughout a test flow) and the single bit can be identified, the single bit may be forgiven. In other words, it may not be required to repair the single bit, but rather the single bit may be corrected via ECC. However, as will be appreciated, processing full visibility data, including transferring full visibility data from a memory device to a testing device requires substantial resources and time.

As described more fully below, various embodiments disclosed herein relate to microelectronic device testing, including encoding test data at a microelectronic device. According to various embodiments, encoded full visibility data (i.e., encoded 1× data), which may enable a tester to log single-bits (e.g., to be used for single-bit forgiveness), may be generated. More specifically, various embodiments relate to testing a memory device, identifying defective column planes and/or bits of a memory device, if any, encoding test data, and possibly identifying memory device failures (e.g., if more than one column plane fails for a specific column plane address). Further, in various embodiments, encoded full visibility data (e.g., 1× visibility to track collision bits) may be provided to determine which specifics bit failed such that error ECC may be used (i.e., to forgive single bits). Compared to conventional devices, systems, and methods, various embodiments may reduce testing time and an amount of data transferred to testing circuits (e.g., either within a memory device or external to the memory device). Further, various embodiments may increase memory device yield and quality by taking advantage of ECC correction capabilities.

Although various embodiments are described herein with reference to memory devices, the present disclosure is not so limited, and the embodiments may be generally applicable to microelectronic devices that may or may not include semiconductor devices and/or memory devices. Embodiments of the present disclosure will now be explained with reference to the accompanying drawings.

FIG. 1 includes a block diagram of an example memory device 100, according to various embodiments of the present disclosure. Memory device 100, which is and may be referred to herein as a memory device, may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL) and /BL, and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 108 over complementary local data lines (LIOT/B), transfer gate (TG), and complementary main data lines (MIOT/B). Conversely, write data outputted from read/write amplifiers 108 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 108, an input/output circuit 162, and data terminal 116. Further, in response to active command ACT, a write signal, a row address XADD, and a column address YADD, write data may be supplied to memory cell array 102 via data terminal 116, input/output circuit 162, read/write amplifier 108, transfer gate TG, and sense amplifier SAMP. The write data may be written to memory cell MC specified by row address XADD and column address YADD.

Clock signals CK and /CK may be received via clock terminals 114. A clock input circuit 170 may generate internal clock signals ICLK based on clock signals CK and /CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

According to various embodiments, input/output circuit 162 may include, or may be coupled to one or more encoders, which, as described more fully below, may be configured to receive test data from memory cell array 102 and, in response thereto, generate one or more signals (e.g., encoded signals) indicative of whether or not one or more column planes are defective, an address of a defective column plane, and/or which bit of a column plane is defective (e.g., if only one column plane is defective and only one bit of the defective column plane is defective).

As will be appreciated by a person having ordinary skill in the art, a "memory mat" generally refers to a subunit of a memory bank having a plurality of memory cells. Each memory mat is defined as a range in which a word line WL and a bit line BL extend. A memory mat may include two or more sub-mats. A sub-mat may also be referred to herein as a "column plane."

Figure 2:
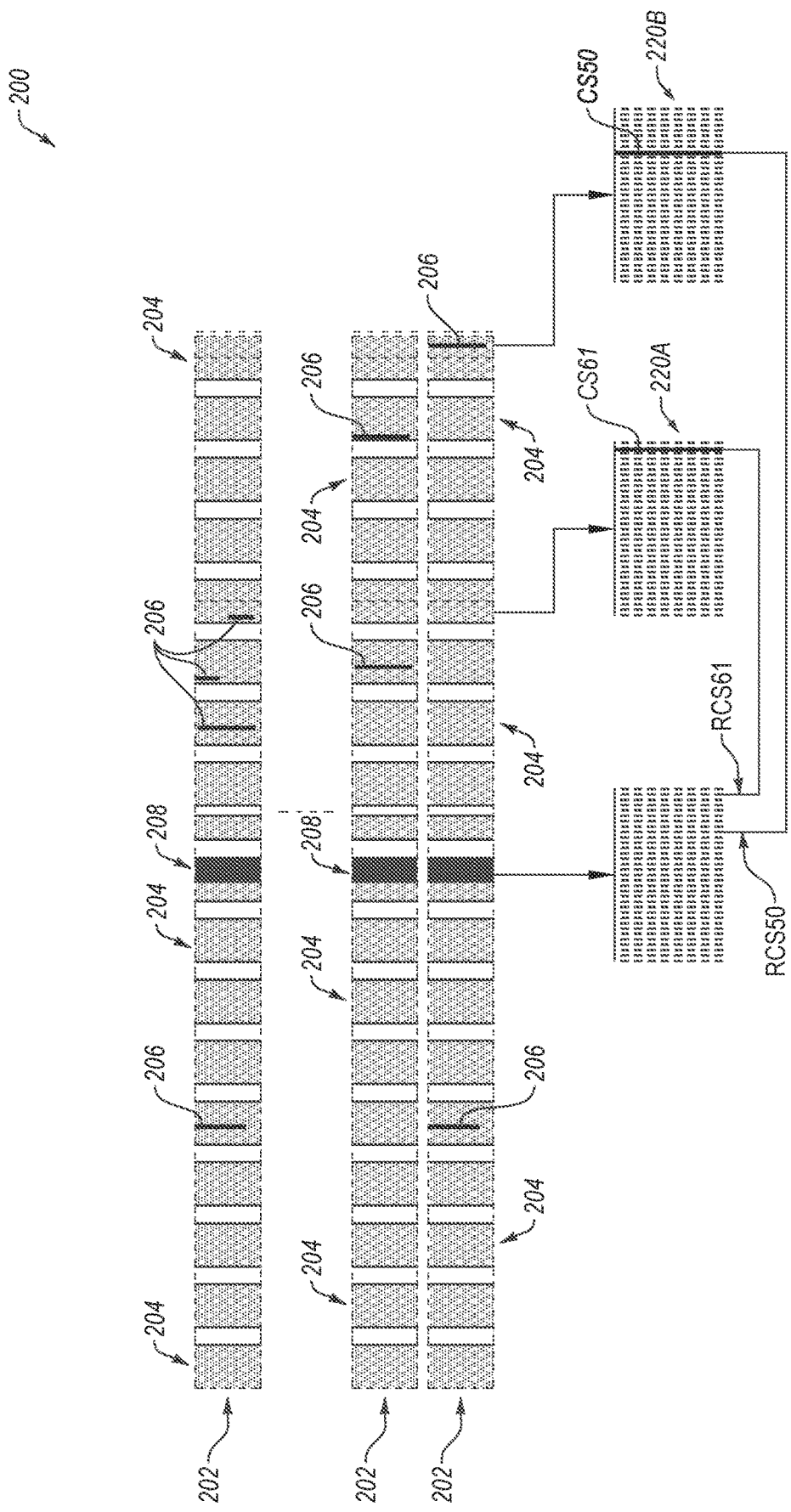
FIG. 2 depicts an example memory device including a portion of a memory array.

FIG. 2 depicts an example device including a portion of a memory array 200. Memory array 200 includes groups (e.g., also referred to herein as "rows") 202 of memory cells, wherein each group 202 includes a number of memory mats 204. As will be appreciated, each memory mat 204 may include a number of (e.g., two) column planes. In other words, each memory mat 204 may include a number of (e.g., two) sub-mats. Further, each column plane includes a number of column select (CS) lines 206 for accessing memory cells at column addresses within each column plane. For example only, each column plane may include 64 CS lines. For example, one or more sense amplifiers (not depicted in FIG. 2) may be positioned between adjacent memory mats of a row 202. Further, for example, one or more sub-word line drivers (not depicted in FIG. 2) may be positioned between adjacent memory mats of different rows 202.

Moreover, each row 202 includes a number of redundant memory cells accessible via redundant column select (RCS) lines. For example, if one or more memory cells accessible via a column select line X of a column plane of a row 202 fails, the one or more memory cells accessible via column select line X may be replaced with one or more memory cells accessible via a column select address X of redundant column plane 208. Similarly, if one or more memory cells accessible via column select line Y of a column plane of a row 202 fails, the one or more memory cells accessible via column select line Y of the column plane may be replaced with one or more memory cells accessible via a column select address Y of redundant column plane 208.

As will be appreciated, in conventional devices, if memory cells accessible via different CS lines of a single column plane of a row 202 fail, the different CS lines of the single column plane may be replaced via associated column select lines of redundant column plane 208. Further, if a memory cell accessible via a first column select line (e.g., CS line A) of a column plane fails, and a memory cell accessible via a second (i.e., different) column select line (e.g., CS line B) of a second (i.e., different) column plane fails, the first column select line (e.g., CS line A) of the column plane may be replaced via an associated column select line (e.g., CS line A) of redundant column plane 208 and the second column select line (e.g., CS line B) of the second column plane may be replaced via an associated column select line (e.g., CS line B) of redundant column plane 208. More specifically, if one or more memory cells accessible via column select line 61 (CS61) of a column plane 220A fail, and one or more memory cells accessible via a column select line 50 (CS50) of a second (i.e., different) column plane 220B fail, column select line 61 (CS61) of column plane 220A may be replaced via column select line 61 (RCS61) of redundant column plane 208 and column select line 50 (CS50) of column plane 220B may be replaced via column select line 50 (RCS50) of redundant column plane 208.

However, in conventional devices, it may not be possible to replace more than one column select line (i.e., in different memory column planes) that correspond to the same column address. For example, if two columns, which correspond to the same column address, fail, it may not be possible to replace both columns. More specifically, if one or more memory cells accessible via a first column select line (e.g., CS line A) of a first column plane fail, and one or more memory cells accessible via the same column select line (e.g., CS line A) of a second (i.e., different) column plane fail, only one of the column select lines may be replaced. In other words, if one or more memory cells accessible via CS61 of column plane 220A fail, and memory cells accessible via CS61 of column plane 220B fail, it may not be possible to replace both column select lines (i.e., CS61 in column plane 220A and CS61 in column plane 220B).

Figure 3:
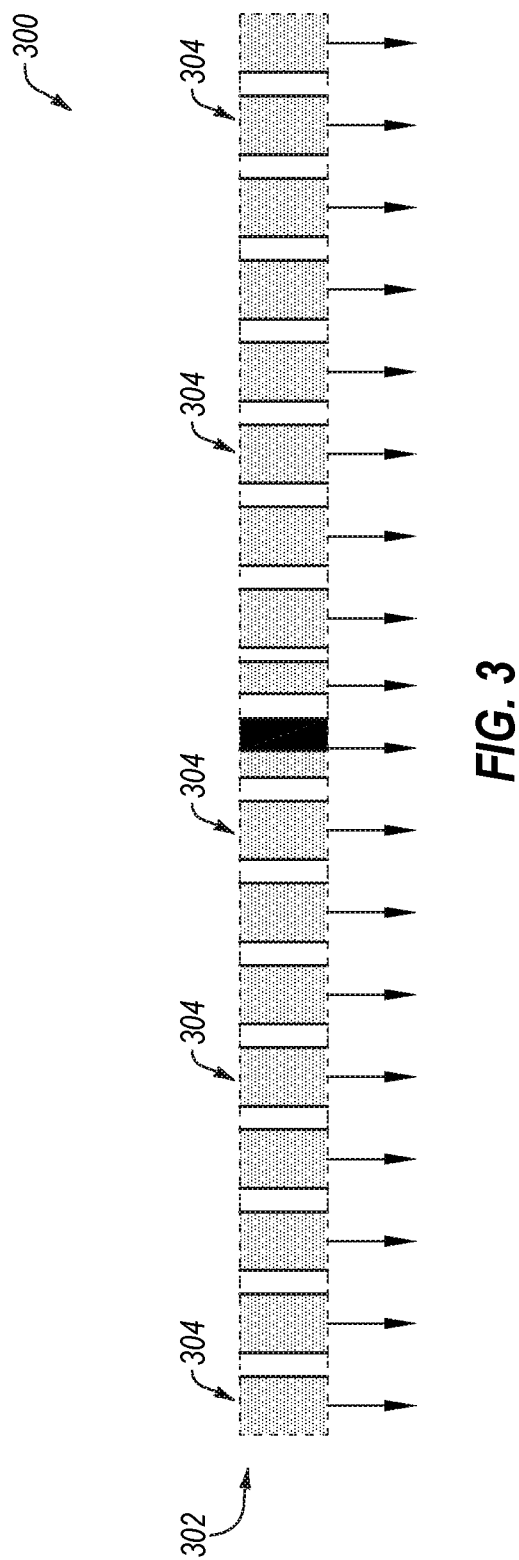
FIG. 3 depicts a number of elements of an example memory array.

FIG. 3 illustrates a number of elements of an example memory array 300. More specifically, memory array 300 includes a group (e.g., a "row") 302 of elements 304. In some embodiments, each element 304 may include a column plane. In other embodiments, each element 304 may include a memory mat having two (2) column planes (i.e., two sub-mats). In conventional systems and/or devices, each column plane of row 302 is tested sequentially (i.e., one by one) to detect failed column planes, if any. More specifically, during testing, for each column address, one bit for each column plane is generated (e.g., sequentially), and based on the generated bit (e.g., output from a column plane), it may be determined whether or not the column plane is defective (i.e., whether the column plane includes one or more defective memory cells) for a specific column address. As will be appreciated, in at least some examples, to test each column plane of a row (e.g., 17 column planes, 35 column planes, without limitation) for a specific column address, N bits of data is read out from the row (e.g., 17*8 bits of data for 17 column planes or 35*8 bits for 35 column planes of data). Thus, it will appreciated that conventional systems and methods for detecting defective column planes are time consuming and resource intensive.

As disclosed in U.S. patent application Ser. No. 16/782, 949 and U.S. patent application Ser. No. 16/685,186, a column plane code (i.e., generated via encoded column plane compression) may include a number of encoded bits for a number of column planes (e.g., 5 encoded bits for 17 column planes or 6 encoded bits for 35 column planes). As will be disclosed more fully below, according to various embodiments, encoded data may include an additional number of bits (e.g., 4 bits) in a read burst to indicate which specific bit in a column plane failed (e.g., if only column plane failed and only one bit in the column plane failed). As will be appreciated, the additional bits may allow for sufficient visibility for global column compression as well as ECC collision visibility. More specifically, for example, the additional bits may include four additional bits for encoded 1× data, or the additional bits may include three additional bits for XORed 2× data (e.g., via a blind compare). Although the additional bits may increase test time and/or an amount of test data (i.e., compared to encoded column plane compression), various embodiments may reduce test time and an amount of test data compared to conventional 1× testing. For example, instead of a read burst including 136 bits for 17 column planes (i.e., 1× visibility), according to various embodiments a read burst may include 9 bits for 17 column planes. As another example, instead of a read burst including 280 bits for 35 column planes (i.e., 1× visibility), according to various embodiments, a read burst may include 10 bits for 35 column planes.

Figure 4A:
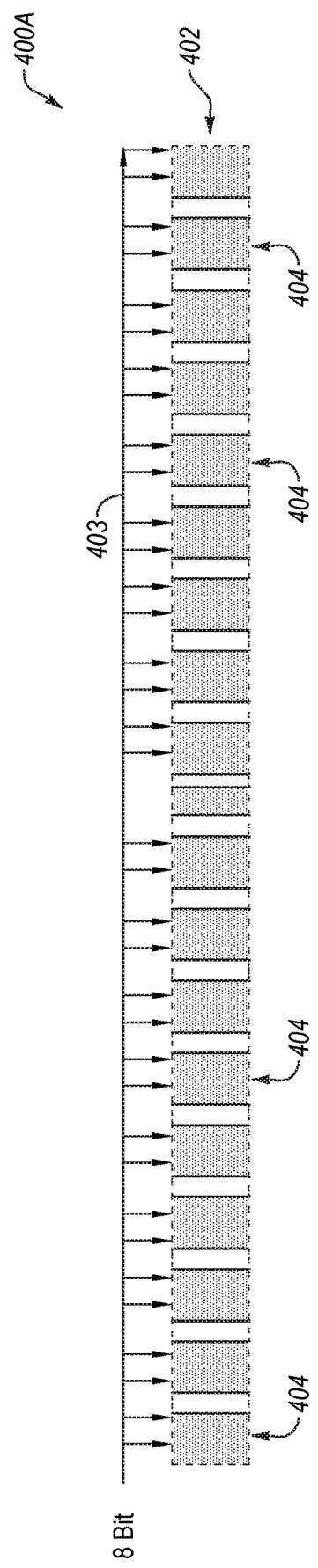
FIG. 4A depicts an example memory device including a number of elements coupled to a bus, according to various embodiments of the present disclosure.

FIG. 4A illustrates a device 400A including a group (e.g., a "row") 402 of elements 404, in accordance with various embodiments of the present disclosure. Device 400A may include and/or may be part of a memory device, such as memory device 100 of FIG. 1. For example, row 402 may be part of a memory bank (e.g., one of the eight memory banks BANK0-7 shown in FIG. 1). In some embodiments, each element 404 may include a column plane. In other embodiments, each element 404 may include a memory mat having two column planes (i.e., two sub-mats).

During a testing operation, for a specific column address, a number of bits (e.g., 8 bits) may be written to each column plane of row 402 via a bus 403. Thus, in an example including 35 column planes, 280 bits (i.e., 35*8) may be written to row 402. Further, a number of bits (e.g., 8 bits) may be read from each column plane of row 402. Thus, in this example, 280 bits (i.e., 35*8) may be read from row 402. Further, the bits written to each column plane of row 402 may be compared to the bits read from each column plane to detect defective column planes for the specific column address, if any.

FIG. 4B depicts a device 400B including elements 404 coupled to an encoder 406, according to various embodiments of the present disclosure. In some embodiments, elements 404 may be part of a memory array 401, which may be part of a memory bank (e.g., one of the eight memory banks BANK0-7 shown in FIG. 1). As a non-limiting example, encoder 406 may be positioned within a peripheral circuit region of a memory device (e.g., memory device 100 of FIG. 1). Further, in some examples, a number of data amplifiers (not shown in FIG. 4) may be positioned between a memory array (e.g., including row 402) and encoder 406. For example, encoder 406 may be part of, or may be coupled to, an input/output circuit, such as input/output circuit 162 of memory device 100 of FIG. 1.

Encoder 406 is coupled to and configured to receive data from each element 404 of row 402. More specifically, encoder 406, which may include one or more circuits, is configured to receive (e.g., substantially simultaneously receive) a first number of bits (e.g., N bits) from row 402, encode (e.g., substantially simultaneously encode) the first number of bits, and output (e.g., substantially simultaneously output) a second number of bits (e.g., M bits), wherein the second number of bits is less than the first number of bits (e.g., M<N).

As noted above, during a contemplated testing operation, for a specific column address, a number of bits (e.g., 8 bits) may be written to each column plane of row 402. More specifically, in one example, 8 bits, each having a high state (e.g., 1) may be written to the specific column address for each column plane of row 402. Subsequently, 8 bits may be read from the specific column address for each column plane of row 402, and the read bits may be compared to the written bits (i.e., to detect defective column planes and generate an M-bit result).

As a more specific example, encoder 406 is configured to receive 8 bits from each column plane of row 402 (e.g., 280 bits (i.e., 35 column planes*8 bits) or 136 bits (i.e., 17 column planes*8 bits)) and output M bits (e.g., M-bit encoded data). For example, if row 402 includes 17 column planes, M may be equal to 9. As another example, if row 402 includes 35 column planes, M may be equal to 10.

Yet more specifically, during a contemplated testing operation of row 402, for each column address, each column plane of row 402 may generate 8 bits, and thus in one example including 35 column planes (i.e., 17.5 memory mats), 280 (i.e., 35*8) bits are generated and received (e.g., simultaneously received) at encoder 406. As a non-limiting example, if each bit generated via a column plane has a first state (e.g., a "0"), the column plane "passes" the test (i.e., the column plane does not include any defective memory cells), and if the column plane generates one or more bits having a second state (e.g., a "1"), the column plane "fails" the test (i.e., the column plane includes one or defective memory cells).

Continuing with the contemplated testing operation, if, for a specific column address, more than one column plane generates a bit having the second state (i.e., more than one column plane fails the test), encoder 406 generates an M-bit output indicating that more than one column plane has failed. More specifically, for example, if, for a specific column address, more than one column plane generates a bit having the second state (i.e., more than one column plane fails the test), encoder 406 may generate an M-bit output (also referred to herein as a "result" or a "signal"), such as "110XXXXXXX," indicating that more than one column plane fails the test.

Further, if each bit generated by each column plane has the first state (i.e., each column plane passed the test), encoder 406 generates an M-bit output indicating that each column plane passed the test. More specifically, for example, if each bit generated by each column plane of row 402 has the first state (i.e., each column plane passed the test), encoder 406 may generate an M-bit output, such as "111XXXXXX," indicating that no column planes have failed the test.

Moreover, if more than one bits fails (i.e., a multi-bit failure), the failing bits may not be forgiven, and a separate code may be generated to indicate a multi-bit failure. More specifically, if for a specific column address, only one column plane fails a test and more than one bit of the column plane has the second state (i.e., two or more bits of the one column plane are defective), encoder 406 generates an M-bit output indicating: 1) which specific column plane failed the test; and 2) a multi-bit failure. More specifically, if only one column plane fails the test and more than one bit of the column plane failed the test, encoder 406 may generate an M-bit value wherein some of the bits of the M-bit value identify the column plane that failed and at least another bit indicates a multi-bit failure.

As a more specific example, if column plane 0 (e.g., the first column plane in row 402) is the only column plane of row 402 to generate a bit having the second state (i.e., "1") and more than one bit of column plane 0 has the second state, encoder 406 generates "0000001XXX" (i.e., 000000 is the binary value for "0" identifying column plane 0, and the third bit (i.e., "1") indicates a multi-bit failure). As another example, if column plane 9 (e.g., the tenth column plane in row 402) is the only column plane of row 402 to generate a bit having the second state (i.e., "1") and more than one bit of column plane 9 has the second state, encoder 406 generates "0010011XXX" (i.e., 001001 is the binary value for "9" identifying column plane 9, and the third bit (i.e., "1") indicates a multi-bit failure). As yet another example, if column plane 33 (e.g., the 34th column plane in row 402) is the only column plane of row 402 to generate a bit having the second state (i.e., "1") and more than one bit of column plane 33 has the second state, encoder 406 generates "1000011XXX" (i.e., 100001 is the binary value for "33" identifying column plane 33, and the third bit (i.e., "1") indicates a multi-bit failure). Further, in this example, the M-bit value (e.g., between "0000001XXX" and "1000101XXX") (i.e., that identifies which column plane failed the test) and the specific column address may be used in a repair process (e.g., to repair a column select line in the failed column plane).

Moreover, according to some embodiments, if only a single bit of a number of bits of a number of column planes fails a test (e.g., in only a single bit of row 402 fails a test), the M-bit value may indicate which specific bit failed. More specifically, if, for a specific column address, only one column plane fails the test and only one bit of the column plane is defective, encoder 406 generates an M-bit output indicating which one specific column plane failed the test and which one specific bit of the one column plane failed. More specifically, if one column plane fails the test and only one bit of the column plane fails, encoder 406 may generate an M-bit value wherein some of the bits of the M-bit value identify the column plane that failed, and some of the bits of the M-bit value identify which bit of the column plane failed.

In a more specific example including 35 column planes, 6 bits of the M-bit value (e.g., between "000000" and "100010" (i.e., between 0-34)) may indicate which column plane (e.g., an address of the column plane) failed the test. In another example including 17 column planes, 5 bits of the M-bit value (e.g., between "000000" and "10000" (i.e., between 0-16)) may indicate which column plane (e.g., an address of the column plane) failed the test. Further, in either example, an additional number of bits (e.g., 4 bits) of the M-bit value may indicate which one bit of the column plane failed.

For example, if column plane 0 (e.g., the first column plane in row 402) is the only column plane of row 402 to generate a bit having the second state (i.e., "1") and bit 7 is the one bit of column plane 0 that failed, encoder 406 may generate "0000000111" (i.e., 000000 is binary value for "0" identifying column plane 0, and 0111 is the binary value for "7" identifying bit 7). As another example, if column plane 9 (e.g., the tenth column plane in row 402) is the only column plane of row 402 to generate a bit having the second state (i.e., "1") and bit 6 is the one bit of column plane 9 that failed, encoder 406 may generate "0010010110" (i.e., 001001 is binary value for "9" identifying column plane 9, and 0110 is the binary value for "6" identifying bit 6). As yet another example, if column plane 33 (e.g., the 34th column plane in row 402) is the only column plane of row 402 to generate a bit having the second state (i.e., "1") and bit 1 is the one bit of column plane 33 that failed, encoder 406 may generate "1000010001" (i.e., 100001 is binary value for "33" identifying column plane 33 and 0001 is the binary value for "1" identifying bit 1). Further, in this example, the M-bit value (i.e., that identifies which column plane failed the test and which bit failed the test) and the specific column address may be used in error forgiveness (e.g., via ECC) and/or a repair process (e.g., to repair a column select line in the failed column plane).

Figure 5:
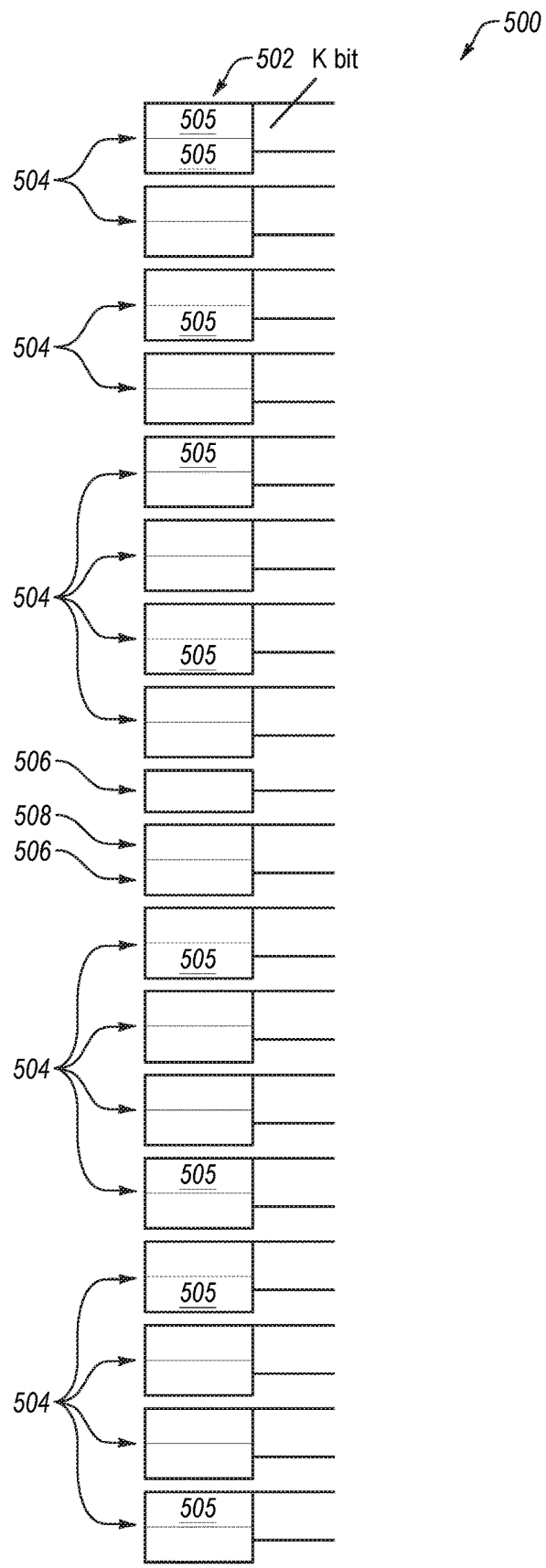
FIG. 5 is another illustration of a number of elements of an example memory array, according to various embodiments of the present disclosure.

FIG. 5 is another illustration of a memory array 500 including a group (e.g., a "row") 502 of elements 504, in accordance with various embodiments of the present disclosure. For example, row 402 of FIG. 4 may include row 502. In this example, each element 504 includes a number (e.g., one or two) of column planes 505. Further, row 502 includes error correcting code (ECC) units 506 and redundancy unit 508. Each column plane 505, each ECC unit 506, and redundancy unit 508 is configured to output a number of bits (e.g., K bits (e.g., 8 bits)). As will be appreciated, ECC units 506 may be used for correcting an error associated with row, and redundancy unit 508 may include redundancy memory cells. As a more specific example, ECC units 506 may be used for forgiving a fail bit of row (e.g., if only one bit failed).

For example, each column plane 505 of row 502 may be coupled to input/output (I/O) circuitry (e.g., I/O circuit 162 of FIG. 1), such as an input/output (DQ) pads (also referred to herein as "data pads"). Thus, in some example, each column plane 505 of row 502 may be configured to read or write 2*K bits (e.g., 2*8 bits) for one column operation.

Figure 6:
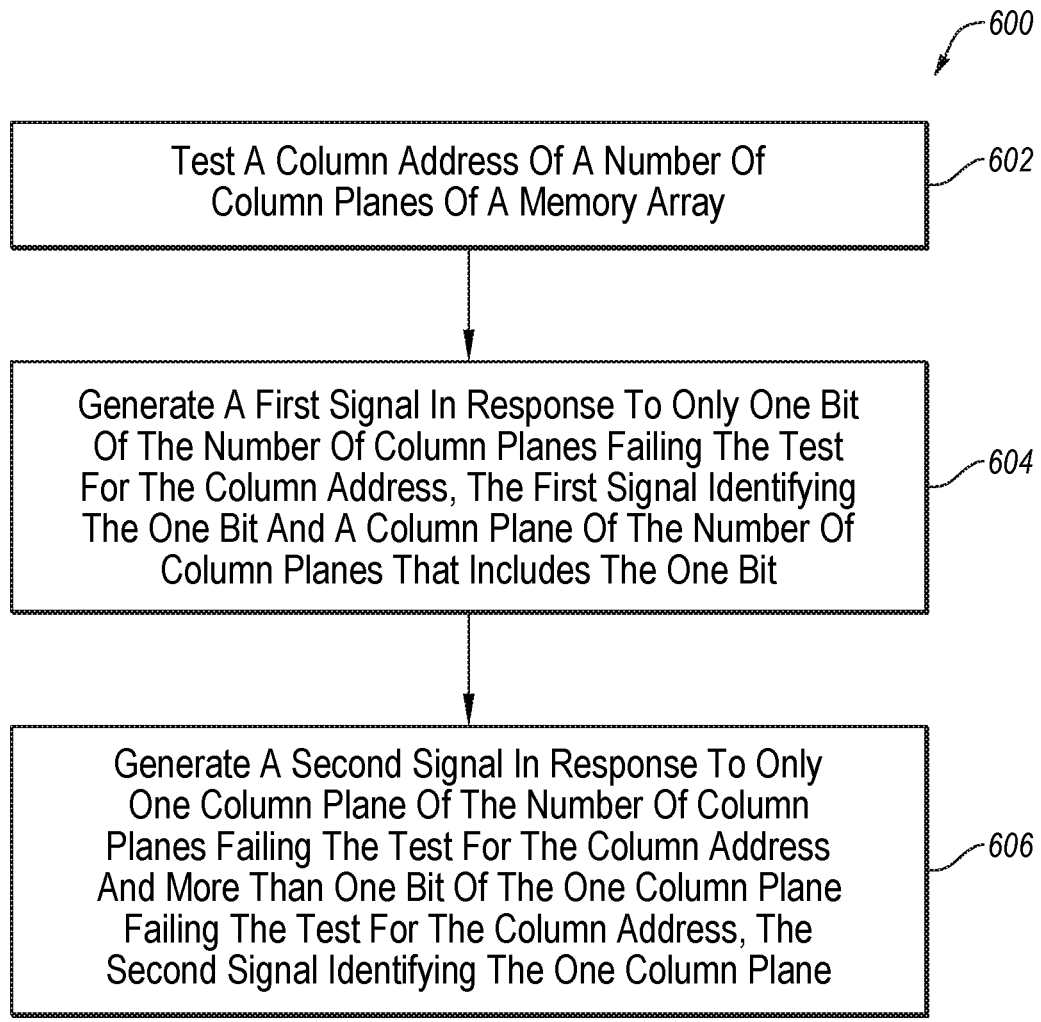
FIG. 6 is a flowchart of an example method of testing a memory device, in accordance with various embodiments of the present disclosure.

FIG. 6 is a flowchart of an example method 600 of testing a memory device, in accordance with various embodiments of the disclosure. Method 600 may be arranged in accordance with at least one embodiment described in the present disclosure. Method 600 may be performed, in some embodiments, by a device or system, such as memory device 100 of FIG. 1, device 400A of FIG. 4A, device 400B of FIG. 4B, memory array 500 of FIG. 5, a memory system 800 of FIG. 8, and/or an electronic system 900 of FIG. 9, or another device or system. Although illustrated as discrete blocks, various blocks may be divided into additional blocks, combined into fewer blocks, or eliminated, depending on the desired implementation.

Method 600 may begin at block 602, wherein a column address for a number of column planes of a memory device may be tested, and method 600 may proceed to block 604. For example, for a first column address of a number of column address, the number of column planes may be written to (e.g., via bus 403 of FIG. 4A). Further, data may be read from the number of column planes, and the write data may be compared (e.g., via encoder 406 of FIG. 4B) to the read data to determine a status (e.g., defective or non-defective) of each of the number of column planes and/or each bit of the number of column planes.

At block 604, a first signal may be generated in response to only one bit of the number of column planes failing the test for the column address, and method 600 may proceed to block 606. The first signal may identify the one bit and a column plane of the number of column planes that includes the one bit. For example, if only bit is determined to be defective (e.g., based on the test performed at block 602), a device (e.g., encoder 406 of FIG. 4B) may generate an M-bit signal that identifies the one bit that is defective and the one column plane that includes the defective bit. More specifically, for example, if column plane 25 is the only column plane having a defective status and a fifth bit of column plane 25 is the only bit that failed the test, the device may generate "0110010101," wherein 011011 is the binary value for "25" and 0101 is the binary value for "5."

At block 606, a second signal may be generated in response to only one column plane of the number of column planes failing the test for the column address and more than one bit of the one column plane having a defective status, wherein the second signal identifies the one column plane. For example, if only one column plane is determined to be defective, but more than one bit of the one column plane is defective (e.g., based on the test performed at block 602), a device (e.g., encoder 406 of FIG. 4B) may generate an M-bit signal that identifies the one column plane that is defective and a multi-bit failure. More specifically, for example, if column plane 25 is the only column plane having a defective status and more than one bit of column plane 25 failed the test, the device may generate "0110011XXX," wherein 011011 is the binary value for "25" and the third bit "1" indicates a multi-bit failure.

Modifications, additions, or omissions may be made to method 600 without departing from the scope of the present disclosure. For example, the operations of method 600 may be implemented in differing order. For example, the act at block 606 may occur before that act of block 604. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein test data, comprising one bit (e.g., indicating a defective or non-defective status) for each column plane of the number of column planes, may be generated. Further, for example, a method may include one or more acts wherein a third signal may be generated in response to each column plane of the number of column planes having a non-defective status for the column address. Moreover, for example, a method may include one or more acts wherein a fourth signal may be generated in response to two or more column planes of the number of column planes having a defective status for the column address. As another example, a method may include one or more acts wherein the first signal, the second signal, the third signal, and/or the fourth signal may be conveyed to test/repair circuitry (e.g., either on the memory device or external to the memory device). Further, for example, a method may include one or more acts wherein one defective bit may be forgiven via ECC of the memory device. In addition, for example, a method may include one or more acts wherein one or more column select lines of a column plane may be replaced with redundant column lines of a redundant column plane of the memory device.

As will be appreciated, some memory devices may not be configured to perform encoded column plane compression. In these cases, to provide full visibility for, for example, 17 column planes, 8 bits are needed to identify which one or more bits of 136 bits (i.e., 17*8=136) are failing. In these conventional examples, two sets of column planes may be read out in a read burst, and thus in this example, the read burst for a single read is 16 bits (2*8).

According to some embodiments of the present disclosure, more than one group ("set") of column planes may be tested together (e.g., substantially simultaneously). More specifically, for example, 34 column planes (e.g., two groups of 17 column planes) may tested together (i.e., to provide encoded 1× data visibility (e.g., for single bit forgiveness)) (e.g., even without encoded column plane compression).

Table 1 below illustrates example bit values for example scenarios for two sets of column planes (i.e., two sets of 17 column planes). As shown in Table 1, 9 bits may be used to identify a "no fail" scenario and single bit failures (i.e., from bit 0 to bit 271). According to various embodiments, single bit failures may be forgiven via ECC. Further, with continued reference to Table 1, 9 bits may be used to identify a multi-bit failure of a first set of column planes (i.e., "110000001") and a multi-bit failure of a first set of column planes (i.e., "110000010"). Moreover, 9 bits may be used to identify a multi-bit failure of both set of column planes (i.e., "110000011"). As will be appreciated, instead of requiring 136 bits for full visibility of 17 column planes, only 9 bits are required in embodiments wherein more than one group of column planes are tested together.

1) that indicates multi-bit failure (e.g., in the first set of column planes and/or the second set of column planes).

Figure 7:
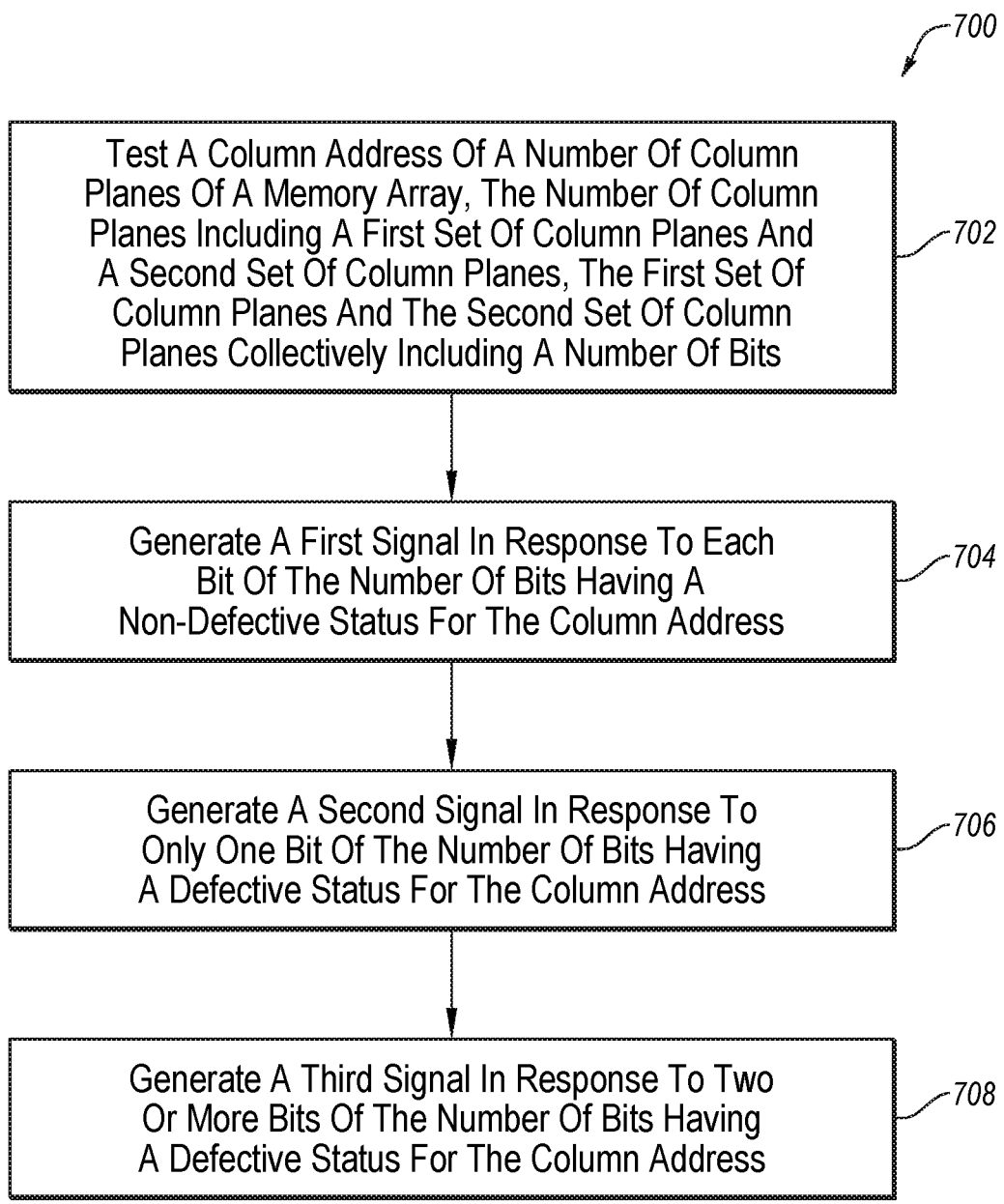
FIG. 7 is a flowchart of another example method of testing a memory device, in accordance with various embodiments of the present disclosure.

FIG. 7 is a flowchart of an example method 700 of testing a memory device, in accordance with various embodiments of the disclosure. Method 700 may be arranged in accordance with at least one embodiment described in the present disclosure. Method 700 may be performed, in some embodiments, by a device or system, such as memory device 100 of FIG. 1, device 400A of FIG. 4A, device 400B of FIG. 4B, memory array 500 of FIG. 5, a memory system 800 of FIG. 8, and/or an electronic system 900 of FIG. 9, or another device or system. Although illustrated as discrete blocks, various blocks may be divided into additional blocks, combined into fewer blocks, or eliminated, depending on the desired implementation.

Method 700 may begin at block 702, wherein a column address for a number of column planes of a memory array may be tested, and method 700 may proceed to block 704. For example, for a first column address of a number of column address, the number of column planes may be written to (e.g., via bus 403 of FIG. 4A). Further, data may be read from the number of column planes, and the write data may be compared (e.g., via encoder 406 of FIG. 4B) to the read data to determine a status (e.g., defective or non-defective) of each of the column planes.

At block 704, a first signal may be generated in response to each bit of a number of bits of the number of column planes having a non-defective status for the column address, and method 700 may proceed to block 706. For example, a first signal (e.g., 000000000; see e.g., Table 1) may be generated in response to each bit a first set of column planes (e.g., a first set of 17 column planes) and a second set of

TABLE 1

| Failing Address | Bit8 | Bit7 | Bit6 | Bit5 | Bit4 | Bit3 | Bit2 | Bit1 | Bit0 |
|---|---|---|---|---|---|---|---|---|---|
| No Fails | 0 | 0 | 0 | 0 | 0 | 0 | 0 | 0 | 0 |
| 0 | 0 | 0 | 0 | 0 | 0 | 0 | 0 | 0 | 1 |
| 1 | 0 | 0 | 0 | 0 | 0 | 0 | 0 | 1 | 0 |
| ... | ... | ... | ... | ... | ... | ... | ... | ... | ... |
| 270 | 1 | 0 | 0 | 0 | 0 | 1 | 1 | 1 | 1 |
| 271 | 1 | 0 | 0 | 0 | 1 | 0 | 0 | 0 | 0 |
| Multi-Bit Fail - First set of 17 Colum Planes | 1 | 1 | 0 | 0 | 0 | 0 | 0 | 0 | 1 |
| Multi-Bit Fail - Second set of 17 Colum Planes | 1 | 1 | 0 | 0 | 0 | 0 | 0 | 1 | 0 |
| Multi-Bit Fail - Both Sets of Colum Planes | 1 | 1 | 0 | 0 | 0 | 0 | 0 | 1 | 1 |

For example, with reference again to FIGS. 4A and 4B, encoder 406 may receive a number of bits from a number (e.g., two) of sets of column planes. More specifically, as a non-limiting example, encoder 406 may receive a number of bits from a first set of 17 column planes and a second set of 17 column planes. Further, in response to each bit of the number of bits passing a test (i.e., each bit has a non-defective status), encoder 406 may output a signal including a number of bits (e.g., 000000000; see Table 1) that indicates that each bit passed. Further, in response to only one bit of the number of bits failing (i.e., having a defective status), encoder 406 may output a signal including a number of bits (e.g., 100001111; see address 270 of Table 1) that indicates a bit location (also referred to herein as "address") of the one bit that failed. Moreover, in response to more than one bit of the number of bits failing (i.e., having a defective status), encoder 406 may output a signal including a number of bits (e.g., 110000001, 110000010, or 110000011; see e.g., Table column planes (e.g., a second set of 17 column planes) having a non-defective status.

At block 706, a second signal may be generated in response to only one bit of the number of bits having a defective status for the column address, and method 700 may proceed to block 708. For example, a second signal (e.g., 000000010; see e.g., Table 1) may be generated in response to only one bit of the number of bits of the first set of column planes (e.g., a first set of 17 column planes) and the second set of column planes (e.g., a second set of 17 column planes) having a defective status.

At block 708, a third signal may be generated in response to two or more bits of the number of bits having a defective status for the column address. For example, a third signal (e.g., 110000001, 110000010, or 110000011; see e.g., Table 1) may be generated in response to two or more bits of the number of bits of the first set of column planes (e.g., a first set of 17 column planes) and the second set of column planes (e.g., a second set of 17 column planes) having a defective status.

Modifications, additions, or omissions may be made to method 700 without departing from the scope of the present disclosure. For example, the operations of method 700 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

As will be appreciated, using one or more of the embodiments disclosed above with reference to FIGS. 4A, 4B, 5, and/or 6, a burst length may be reduced from, for example, 136 bits to 9 bits (or from 280 bits to 10 bits). Further, using one or more of the embodiments disclosed above with reference to FIGS. 4A, 4B, 5, and/or 7, a burst length may be reduced from, for example, 272 bits to 9 bits. Accordingly, encoded 1× data (e.g., for ECC collision bits visibility and single-bit forgiveness) may be generated in a test time that is less than a test time required to generate true 1× data.

A memory system is also disclosed. According to various embodiments, the memory system may include a memory device (e.g., memory device 100 of FIG. 1) including one or more memory cell arrays. FIG. 8 is a simplified block diagram of a memory system 800 implemented according to one or more embodiments described herein. Memory system 800, which may include, for example, a semiconductor device, includes a memory array 802 and circuitry 804, which may include, for example only, an encoder (e.g., encoder 406 of FIG. 4B), as described herein. Memory array 802, which may include a number of memory banks, may include a number of memory cells. Circuitry 804, may be operatively coupled with memory array 802, may be configured for carrying out one or more embodiments disclosed herein. Memory system 800 may also include a controller (not shown in FIG. 8) coupled to memory array 802 and/or circuitry 804.

An electronic system is also disclosed. According to various embodiments, the electronic system may include a memory device including a number of memory dies, each memory die having an array of memory cells. Each memory cell may include an access transistor and a storage element operably coupled with the access transistor.

FIG. 9 is a simplified block diagram of an electronic system 900 implemented according to one or more embodiments described herein. Electronic system 900 includes at least one input device 902, which may include, for example, a keyboard, a mouse, or a touch screen. Electronic system 900 further includes at least one output device 904, such as a monitor, a touch screen, or a speaker. Input device 902 and output device 904 are not necessarily separable from one another. Electronic system 900 further includes a storage device 906. Input device 902, output device 904, and storage device 906 may be coupled to a processor 908. Electronic system 900 further includes a memory device 910 coupled to processor 908. Memory device 910 which may include memory system 800 of FIG. 8. Electronic system 900 may include, for example, a computing, processing, industrial, or consumer product. For example, without limitation, electronic system 900 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the present disclosure may include a device. The device may include a memory array including a number of column planes and at least one circuit coupled to the memory array. The at least one circuit may be configured to receive test result data for a column address for each column plane of the number of column planes of the memory array. The at least one circuit may also be configured to convert the test result data to a first result responsive to only one bit of a number of bits of the number of column planes failing a test for the column address, wherein the first result identifies the one bit and a column plane of the number of column planes that includes the one bit. Moreover, the at least one circuit may be configured to convert the test result data to a second result responsive to only one column plane failing the test for the column address and more than one bit of the one column plane being defective, wherein the second result identifies the one column plane.

According to another embodiment of the present disclosure, a method of testing a memory device may include testing a column address of a number of column planes of a memory array. The method may also include testing a column address of a number of column planes of a memory array. The method may further include generating a first signal in response to only one bit of the number of column planes failing the test for the column address, wherein the first signal identifies the one bit and a column plane of the number of column planes that includes the one bit. Moreover, the method may include generating a second signal in response to only one column plane of the number of column planes failing the test for the column address and more than one bit of the one column plane failing the test for the column address, wherein the second signal identifies the one column plane.

In accordance with another embodiment of the present disclosure, a device may include a memory array including a number of column planes. The device may also include at least one circuit coupled to the memory array. The at least one circuit may be configured to test a column address of the number of column planes of the memory array, wherein the number of column planes including a first set of column planes and a second set of column planes, and the first set of column planes and the second set of column planes collectively including a number of bits. The at least one circuit may also be configured generate a first signal in response to each bit of the number of bits having a non-defective status for the column address. Further, the at least one circuit may be configured to generate a second signal in response to only one bit of the number of bits having a defective status for the column address wherein the second signal identifies an address of the one bit. Moreover, the at least one circuit may be configured to generate a third signal in response to two or more bits of the number of bits having a defective status for the column address.

Additional embodiments of the present disclosure include a system. The system may include at least one input device, at least one output device, and at least one processor device operably coupled to the input device and the output device. The system may also include at least one memory device operably coupled to the at least one processor device and comprising circuitry. The circuitry may be configured to write data to each column plane of N column planes of the at least one memory device, and read data from each column plane of the N column planes. The circuitry may also be configured to compare the write data to the read data to generate N-bit test data. The circuitry may be configured to convert the N-bit test data to a first M-bit result responsive to a single bit of a number of bits of the N column planes being defective, wherein the first M-bit result identifies the single bit and a column plane of the N column planes that includes the single bit. Further, the circuitry may be configured to convert the N-bit test data to a second, different M-bit result responsive to only one column plane of the N column planes being defective and two or more bits of the one column plane being defective, wherein the second, different M-bit result identifies the one column plane.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
   a memory array including a number of column planes; and
   at least one circuit coupled to the memory array and configured to:
      receive test result data for a column address for each column plane of the number of column planes of the memory array;
      convert the test result data to a first result responsive to only one bit of a number of bits of the number of column planes failing a test for the column address, the first result including a first number of bits identifying the one bit and a second number of bits identifying a column plane of the number of column planes that includes the one bit; and
      convert the test result data to a second result responsive to only one column plane failing the test for the column address and more than one bit of the one column plane being defective, the second result including a third number of bits identifying the one column plane and a fourth number of bits identifying the more than one bit.

2. The device of claim 1, wherein the at least one circuit is further configured to convert the test result data to a third result responsive to two or more column planes of the number of column planes failing the test for the column address.

3. The device of claim 2, wherein the at least one circuit is further configured to convert the test result data to a fourth result responsive to no column planes of the number of column planes failing the test for the column address.

4. The device of claim 1, wherein the at least one circuit is further configured to convert the test result data to a third result responsive to either two or more column planes of the number of column planes failing the test for the column address or no column planes of the number of column planes failing the test for the column address.

5. The device of claim 1, wherein the test result data comprises 280 bits, and each of the first result and the second result comprises 10 bits.

6. The device of claim 1, wherein the test result data comprises 136 bits, and each of the first result and the second result comprises 9 bits.

7. The device of claim 1, wherein the first number of bits includes four bits identifying the one bit and the second number of bits includes either five or six bits identifying the column plane that includes the one bit.

8. A method, comprising:
 testing a column address of a number of column planes of a memory array;
 generating a first signal in response to only one bit of the number of column planes failing the test for the column address, the first signal including a first number of bits identifying the one bit and second number of bits identifying a column plane of the number of column planes that includes the one bit; and
 generating a second signal in response to only one column plane of the number of column planes failing the test for the column address and more than one bit of the one column plane failing the test, the second signal including a third number of bits identifying the one column plane and a fourth number of bits identifying the more than one bit.

9. The method of claim 8, further comprising generating a third signal in response to each column plane of the number of column planes passing the test for the column address.

10. The method of claim 9, further comprising generating a fourth signal in response to two or more column planes of the number of column planes failing the test for the column address.

11. The method of claim 8, further comprising generating N bits in response to the testing, wherein generating the first signal comprises encoding the N bits to M bits, wherein M<N.

12. The method of claim 11, wherein encoding N bits to M bits comprises either encoding 136 bits to 9 bits or encoding 280 bits to 10 bits.

13. The method of claim 8, further comprising, in response to the first signal, forgiving the one bit via an error correction code (ECC).

14. The method of claim 8, further comprising, in response to the second signal, replacing the one column plane with a redundant column plane.

15. A device, comprising:
 a memory array including a number of column planes; and
 at least one circuit coupled to the memory array and configured to:
  test a column address of the number of column planes of the memory array, the number of column planes including a first set of column planes and a second set of column planes, the first set of column planes and the second set of column planes collectively including a number of bits;
  generate a first signal in response to each bit of the number of bits having a non-defective status for the column address;
  generate a second signal in response to only one bit of the number of bits having a defective status for the column address, the second signal identifying an address of the one bit; and
  generate a third signal in response to two or more bits of the number of bits having a defective status for the column address.

16. The device of claim 15, wherein the at least on circuit is configured to generate the third signal in response one of:
 two or more bits of the first set of column planes having a defective status;
 two or more bits of the second set of column planes having a defective status; and
 two or more bits of each of the first set of column planes and the second set of column planes having a defective status.

17. The device of claim 15, wherein each of the first set of column planes and the second set of column planes includes 17 column planes and each of the first signal, the second signal, and the third signal comprises 9 bits.

18. A system, comprising:
 at least one input device;
 at least one output device;
 at least one processor device operably coupled to the input device and the output device; and
 at least one memory device operably coupled to the at least one processor device and comprising:
  circuitry configured to:
   write data to each column plane of N column planes of the at least one memory device;
   read data from each column plane of the N column planes;
   compare the write data to the read data to generate N-bit test data;
   convert the N-bit test data to a first M-bit result responsive to a single bit of a number of bits of the N column planes being defective, the first M-bit result including a first number of bits identifying the single bit and a second number of bits identifying a column plane of the N column planes that includes the single bit; and
   convert the N-bit test data to a second, different M-bit result responsive to only one column plane of the N column planes being defective and two or more bits of the one column plane being defective, the second, different M-bit result including a third number of bits identifying the one column plane and a fourth number of bits identifying the two or more bits.

19. The system of claim 18, wherein the circuitry is further configured to convert the N-bit test data to a third M-bit result responsive to no column planes of the N column planes being defective, wherein a value of N is greater than a value of M.

20. The system of claim 19, wherein the circuitry is further configured to convert the N-bit test data to a fourth, different M-bit result responsive to two or more column planes of the N column planes being defective.

* * * * *